United States Patent
Fischer et al.

(10) Patent No.: US 6,987,067 B2
(45) Date of Patent: Jan. 17, 2006

(54) SEMICONDUCTOR COPPER LINE CUTTING METHOD

(75) Inventors: Lawrence Fischer, Poughkeepsie, NY (US); Steven B. Herschbein, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 180 days.

(21) Appl. No.: 10/225,517

(22) Filed: Aug. 21, 2002

(65) Prior Publication Data

US 2004/0038433 A1   Feb. 26, 2004

(51) Int. Cl.
*H01L 21/302*   (2006.01)
*H01L 21/461*   (2006.01)

(52) U.S. Cl. .................. 438/712; 438/742; 216/66; 216/78; 204/192.34; 204/298.36

(58) Field of Classification Search ............ 204/192.34, 204/298.36; 216/66, 72, 78; 438/712, 720, 438/738, 742
See application file for complete search history.

(56) References Cited

U.S. PATENT DOCUMENTS

| | | | |
|---|---|---|---|
| 4,609,809 A | | 9/1986 | Yamaguchi |
| 5,171,709 A | | 12/1992 | Donelon |
| 5,182,230 A | | 1/1993 | Donelon |
| 6,004,437 A | | 12/1999 | Lee |
| 6,077,618 A | | 6/2000 | Sakakima |
| 6,159,859 A | * | 12/2000 | Robertson, III et al. .... 438/706 |
| 6,410,418 B1 | * | 6/2002 | Yang ........................... 438/626 |
| 6,509,276 B2 | * | 1/2003 | Scott .......................... 438/712 |
| 6,641,705 B2 | * | 11/2003 | Phaneuf et al. ........ 204/192.34 |

* cited by examiner

*Primary Examiner*—Amir Zarabian
*Assistant Examiner*—Pamela E Perkins
(74) *Attorney, Agent, or Firm*—Steven Capella; William P. Skladony

(57) ABSTRACT

A method of repairing a semiconductor chip containing copper is taught, whereby copper is selectively removed from the chip. The method involves processing the chip inside a chamber in which the chip is exposed to various gases and an energy source, such as a focused ion beam. To the extent the chip may have non-copper materials, such as nitride and oxide layers, on top of the copper that is to be removed, those non-copper materials will first be selectively removed. Such removal typically results in a hole (a so-called "elevator shaft") leading to the copper that is to be removed. Next, the method teaches the introduction of a combination of nitrogen and oxygen into the chamber and the directing of the ion beam at the spot where the copper is to be removed. In this manner, the copper on the chip is cleanly and reliably removed, without causing damage to the processing chamber.

20 Claims, 3 Drawing Sheets

SEMICONDUCTOR COPPER LINE CUTTING METHOD

FIELD OF THE INVENTION

The present invention generally relates to a method for cutting copper lines embedded in a semiconductor chip.

BACKGROUND OF THE INVENTION

It is well known in the semiconductor manufacturing art that the extremely tiny semiconductor components (hereinafter referred to as "chips") are generally made up of a base substrate material, such as silicon. Disposed on top of that base are layers of insulation, such as silicon dioxide, and conductive materials, such as metals, which form the complex circuitry of the chip. If one were to examine a delaminated or cross sectioned modem semiconductor chip, which would necessarily require many degrees of magnification, one would see a complex pattern of circuit devices, such as transistors, and multi-leveled, crisscrossing wiring that connects the circuit devices together. For may years, one such metal which was typically used in connection with the manufacture of semiconductors was aluminum. In the last several years, however, copper has become a viable substitute for aluminum in this application.

As is known to those skilled in the art, the actual manufacture of a semiconductor chip is a complex and time consuming process, involving many steps which are dependent upon the usage of tools, materials, and semiconductor masks. Accordingly, once a given chip is manufactured, if the chip proves to be defective, due, for example, to a given wire on the chip making an incorrect contact, it is not easy or expedient to simply create a revised set of masks, and manufacture a new batch of chips. Instead, significant delays may be incurred between the time the wiring problem is detected and actual manufacture of a new chip with correct wiring. Any such delay can have a significant negative effect on the launching of a commercial computer product that is dependent upon the chip because other designers involved with the launch of the complete product may be delayed in doing their work on the project. For example, there may be a staff of computer software programmers waiting to have access to the chip so that they can create software that will run on the chip. Hence, delays in being able to access an actual chip may impact their schedule, which can then have a ripple effect on other stages of the project, too.

To address this overall problem, it is known in the semiconductor manufacturing art to repair a defective chip after it is manufactured. For example, see U.S. Pat. Nos. 5,171,709 and 5,182,230 both to Donelon et al., generally describing the processes for repairing integrated circuits. Through the repair process individual wires inside the chip may be exposed, cut, rerouted, and sometimes reconnected to other wires. Due to the extremely tiny size of these individual wires, the repair process requires considerable precision and time. Thus, the repairing of individual chips is generally not a very cost effective approach to fixing problems with a commercial quantity of chips, but the repair process is suitable for fixing problems with a much smaller number of defective chips, like the number that may be manufactured as prototypes. Importantly, the repair of a relatively small number of prototype chips is a process that addresses the issue discussed above, namely it enables the defective chip to be fixed well enough so that it can be made available for further viability testing and used by other members of a system design team, such as the software programmers.

The repair process generally starts with the determination of what part of the chip needs to be reworked. For example, it may be determined that a given wiring connection should not be made, in which case the objective of the repair would be to cut and terminate the given conductive line on the chip. Or, it may be determined that a given wiring connection should be re-routed to make contact with a point to which it was not originally connected, in which case the objective of the repair would be to cut the given conductive line and reconnect it to the different point. Hence, in many rework processes, the insulative materials of the chip must be selectively removed to expose the conductive wires that need to be cut. Then, the wires themselves need to be selectively cut, too. In order to do the selective removal of the insulative material and the conductive wire, the chip is generally placed in a chamber, into which various gases may be pumped. With the introduction of the right gases, a focused ion beam (FIB) is then used to precisely cut and remove the materials that need to be removed in order to accomplish the repair. Thus, it is the combination of the chemical properties of the gases with the materials of the chip, as made reactive by the ion beam, that all serve to accomplish the selective cutting and removal of materials.

As the semiconductor industry transitioned from aluminum conductive wiring to copper conductive wiring on chips, certain problems developed when attempting to repair chips containing copper. Specifically, gases that had been used successfully in connection with the removal of aluminum conductive lines were proven to be unsuccessful in connection with the removal of copper conductive lines. For example, certain gases customarily used with aluminum were found to spontaneously react with copper, by which is meant that they were not made to react only when excited by an ion beam, but instead they reacted with the copper even without ion beam excitation. Consequently, the use of such gases make it impossible to precisely control the copper removal process, which is essential. Still other gases typically used with aluminum have a tendency to cause copper to evaporate, but then deposit on the sidewalls of the hole that exposed the copper line. This is not desirable since it may create electrical contacts and shorts where they are not intended. Instead it is preferred that any copper that is cut by the ion beam form a reactive specie with the gas in the chamber so that it can be pumped out of the chamber. Yet another problem with known approaches is that certain gases which might work well with copper may have a tendency to attack and damage the internal components of the chamber, which also proved unworkable.

In view of the foregoing, what is needed is a method for cutting copper wires in a semiconductor chip, and in particular a method which is precise and which does not damage the chamber in which the cutting process takes place.

SUMMARY OF THE INVENTION

In accordance with the preferred embodiment of the present invention, a method for cutting a copper line (wire) on a semiconductor chip is provided. More specifically, the preferred embodiment of the method involves the use of a FIB system, which generally includes a chamber into which gas can be pumped while an ion beam (such as gallium) is directed at the specific target, namely the chip. At the commencement of the process the chip is placed in the FIB chamber. Then, gases (such as $XeF_2$) are introduced into the chamber and the ion beam is targeted at the chip for the purpose of removing the dielectric layers of the chip, which are immediately above the portion of the copper line that is to be cut. In this manner a hole is essentially drilled in the chip down to the copper line. Once the copper line is exposed, a combination of nitrogen ($N_2$) and oxygen ($O_2$) are bled into the chamber. With the $N_2/O_2$ gas in the chamber the ion beam is again targeted at the chip this time for the purpose of cutting the copper line.

It is therefore an object of the present invention to provide a method for cutting copper lines on semiconductor chips.

It is also an object of the invention to provide such a method which is controlled and precise, and does not cause a spontaneous reaction between the gas used and the composition, including the copper, of the semiconductor.

It is another object of the invention to provide such a method which does not damage the chamber in which the cutting process takes place.

DETAILED DESCRIPTION OF THE PREFERRED EMBODIMENT OF THE INVENTION

Figure 1:
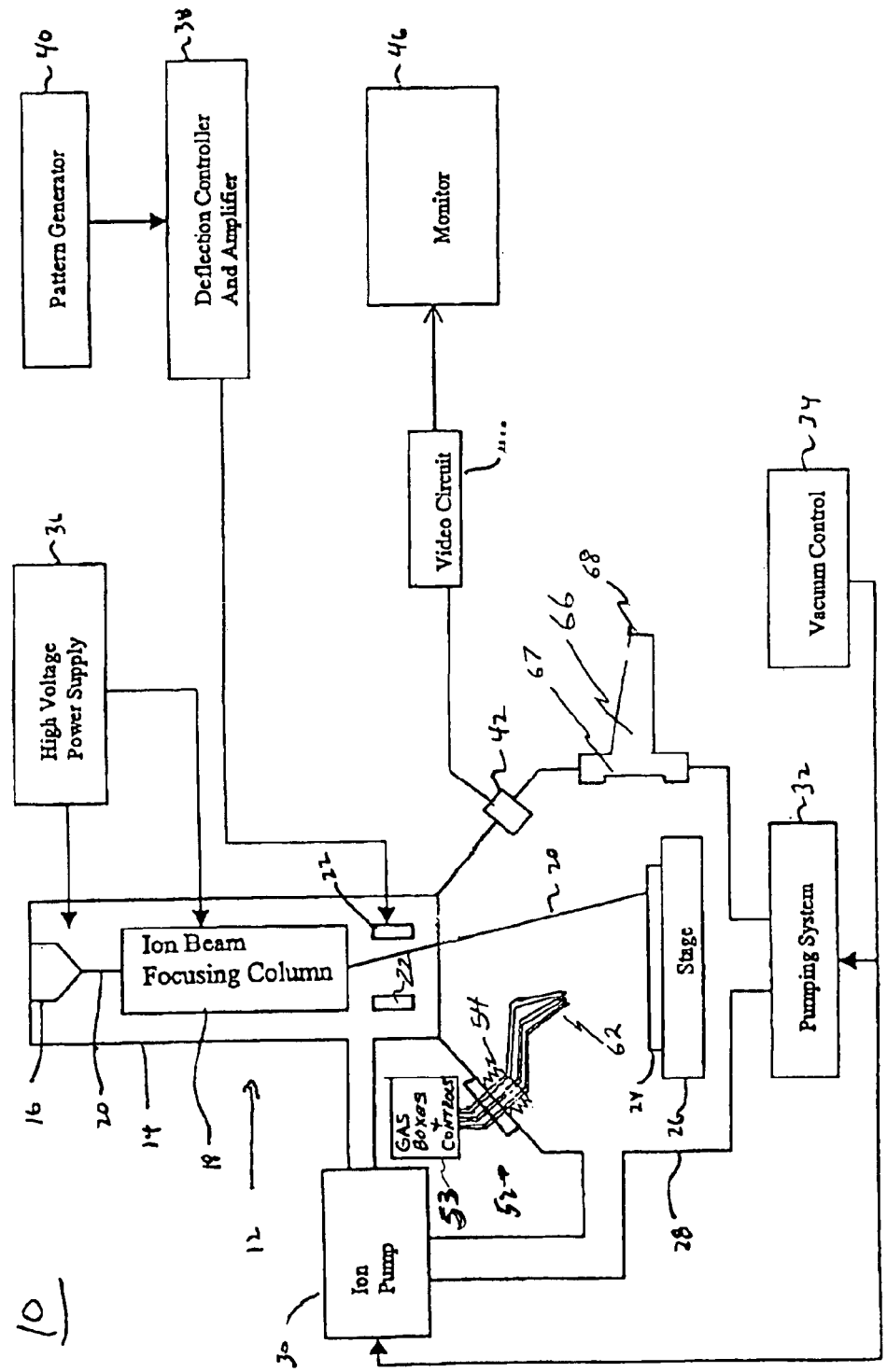
FIG. 1 is a block diagram showing a FIB system in which the preferred embodiment of the invention is practiced on a semiconductor chip containing copper wiring.

The preferred embodiment is directed to a method for cutting copper lines embedded in a semiconductor chip; however, the disclosed process is generally adapted for the removal of any type of copper structure on a semiconductor chip. The environment in which the preferred embodiment is practiced is generally shown in FIG. 1, which presents an overview of a Focused Ion Beam (FIB) system 10. Such FIB systems 10 are commercially available and are commonly used throughout the microelectronics industry as "chip repair" tools. The models 9100 and 9500 manufactured by Micrion, a division of FEI Co., would be suitable FIB systems for use with the preferred embodiments discussed in connection with this detailed description. As shown in FIG. 1, FIB system 10 includes an evacuated envelope 12 having an upper portion 14 within which are located a liquid metal ion source 16 and a focusing column 18 which includes extractor electrode means and an electrostatic optical system. Ion beam 20 passes from the liquid metal source 16 through column 18 and between electrostatic deflection plates 22. Electrostatic deflection plates 22 direct the beam at chip 24, which is a semiconductor device positioned on a stage 26 within chamber 28. In the preferred embodiment, chip 24 is a semiconductor device manufactured to include layers of conductive copper lines sandwiched in between intermediate layers of insulation, such as silicon dioxide.

FIB system 10 further includes an ion pump 30 that is employed for evacuating the upper portion 14. The chamber 28 is evacuated, preferably with a turbo molecular and mechanical pumping system 32 under the control of vacuum controller 34. High voltage power supply 36 is connected to the liquid metal ion source 16 as well as to appropriate electrodes in the ion beam focusing column 18 for forming an ion beam 20 and directing the same downwardly toward chip 24. Deflection controller and amplifier 38, operated in accordance with a prescribed pattern, provided by pattern generator 40, is coupled to deflection plates 22 whereby ion beam 20 may be controlled to trace a defined pattern on chip 24, wherein that traced pattern will determine which part of chip 24 is going to be cut.

The ion source 16 typically provides a metal ion beam of gallium (although other sources are possible and have been discussed in the literature as an alternative to gallium). The high voltage power supply 36 provides an appropriate acceleration voltage to electrodes in ion beam focusing column 18 for energizing and focusing ion beam 20. An electron multiplier 42 used for detecting secondary emission for imaging is connected to a video circuit and amplifier 44, the latter supplying the drive for video monitor 46 also receiving deflection signals from deflection controller and amplifier 38. As will be detailed below, in order to remove the copper from chip 24 two different chemicals ($N_2$ and $O_2$) need to be present on the surface of chip 24 at the same time. In the preferred embodiment, a commercially available FIB tool was equipped with several separate gas chemistry delivery channels. This allows for the mixing of these gases to actually take place at the point of delivery within the chamber. Further, it enables variable gas concentrations and ratios for the purpose of process optimization.

Each channel originates with a chemical source. The source can start out in any phase-solid, liquid, or gas. In all cases the chemistry needs to be delivered to the chamber in the gaseous phase, but a gas can be derived from a solid or liquid thru sublimation or evaporation, respectively. Within each channel the derived gas is routed through a mass flow controller with variable set point and feedback for providing a suitable final vapor pressure in accordance with art recognized practices. Each channel terminates within the confines of the chamber with a separate gas delivery nozzle, which is generally designated as nozzle cluster 62 in FIG. 1. The multiple individual nozzles in nozzle cluster 62 allow any or all of the gases available to be released onto the surface of chip 24 at the same time. A single extension of the cluster assembly places all of the gas nozzles in close proximity to the chip surface.

In the preferred embodiment, nozzle cluster 62 comprises four capillary tubes which extend from the roof of the chamber 28, and are connected thru control valves and flow controllers to the individual chemical source reservoirs, together generally designated as gas box and controls 53. These serve the purpose of delivering precise amounts of gaseous vapor. The nozzle assembly is extended and translated in orthogonal directions substantially perpendicular to its axis employing translation apparatus 54, so that gaseous vapor can be aimed directly toward a region on the top surface of chip 24.

Access to the inside of chamber 28 is provided by a loadlock sample exchange port 66. Port 66 is separated from the main chamber 28 by a gate valve 67, which is large enough to allow the sample (chip 24), the sample holder, and the transport mechanism to pass into the interior of chamber 28. Door 68, when opened, allows the insertion of chip 24 into the pump down chamber (loadlock exchange port). A roughing pump draws a vacuum in this outer chamber until it begins to approach the pressure of chamber 28. A valve between the chambers equilibrates the vacuum level, then the gate valve opens allowing chip 24 to pass from the outer to the inner chamber. A column isolation valve may be present to seal off and protect the ion source and focusing column apparatus in the event of chamber vacuum loss.

Figure 2A:
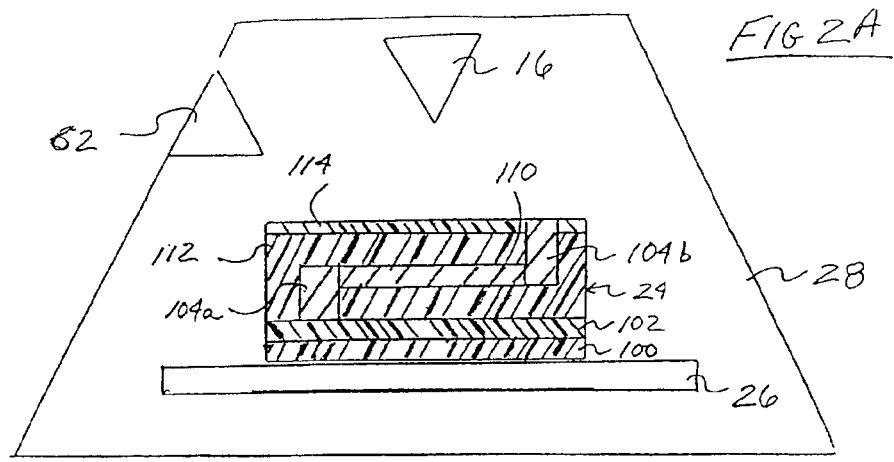
FIGS. 2A–C are a sequence of illustrations showing further details of the semiconductor chip in FIG. 1 as it is operated on by the process of the preferred embodiment.
Figure 2B:
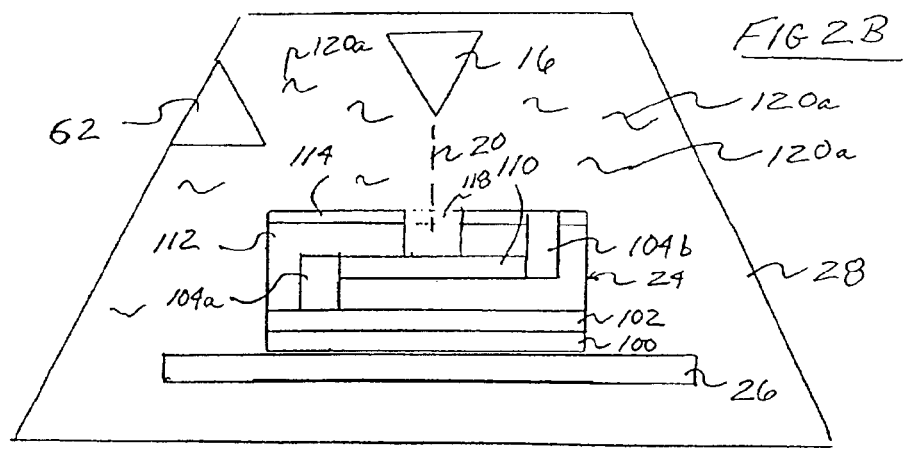
Figure 2C:
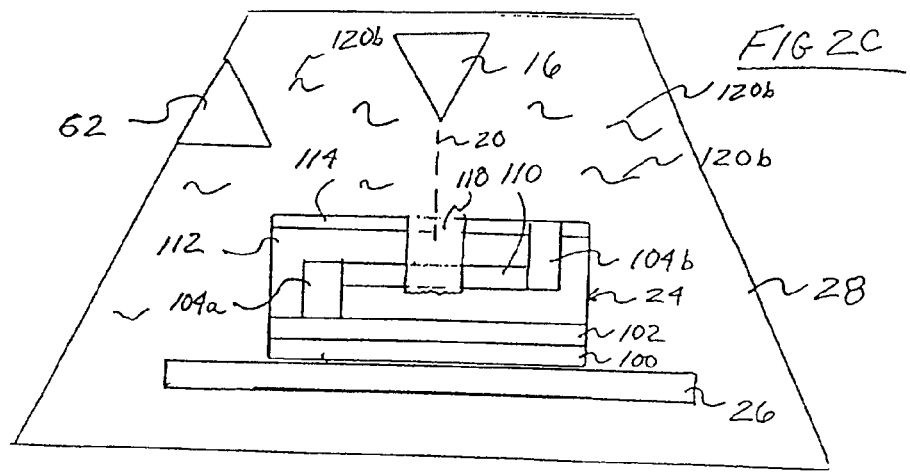
Figure 3:
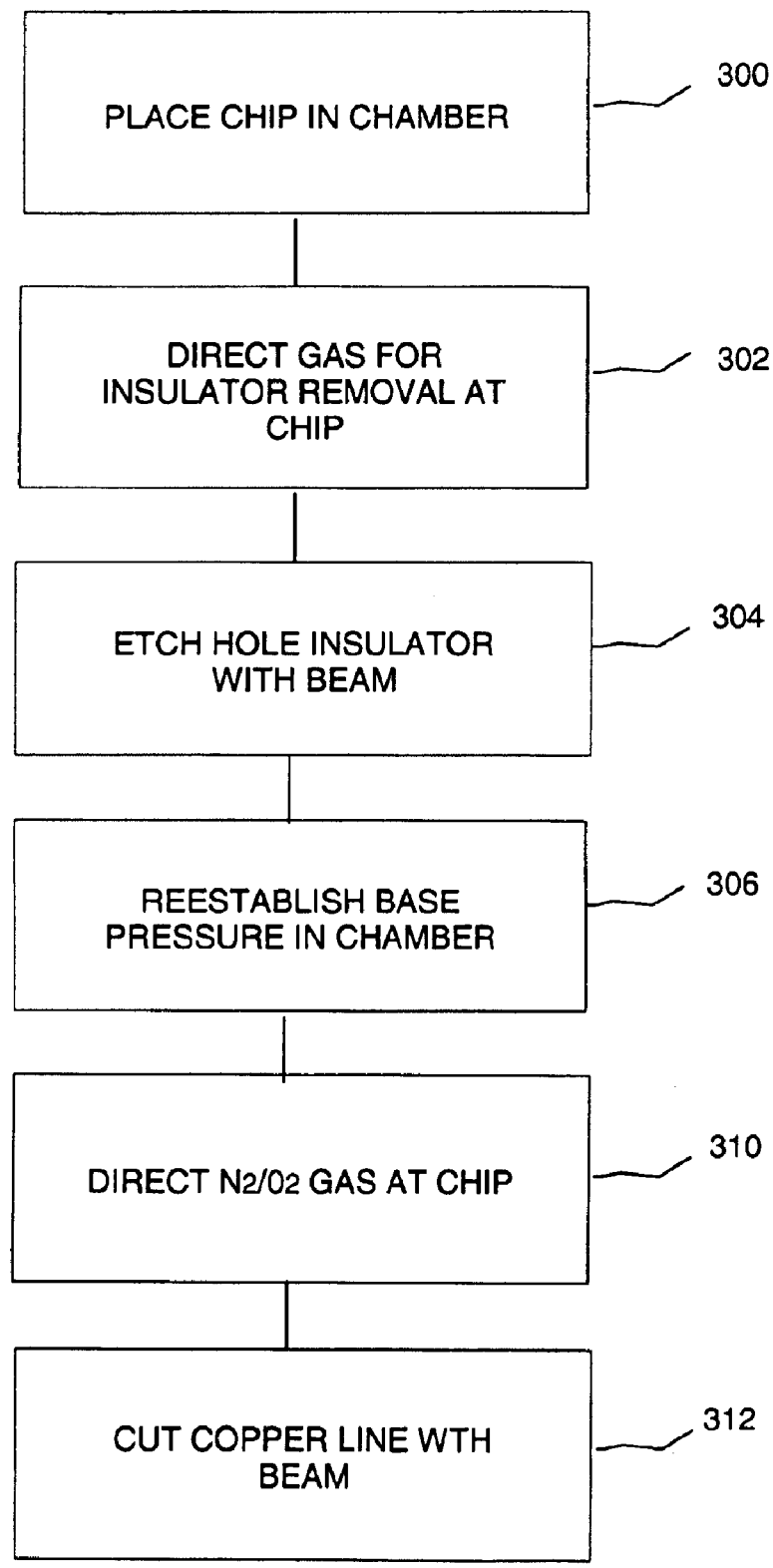
FIG. 3 is a flow diagram outlining the major steps of the process of the preferred embodiment.

Having described the general components of FIB system 10, further specifics are now provided on the processing of chip 24. As indicated above, the preferred embodiment of the process is applied in an environment in which chip 24 is made up of a semiconductor device having one or more copper lines that need to be cut for purposes of chip repair. Accordingly, FIGS. 2A–C provide a sequence of illustrations showing the effects of processing chip 24, in accordance with the preferred embodiment, inside chamber 28 of the FIB system 10, shown in FIG. 1. As will be noted from a quick look at FIGS. 2A–C, the illustration of chamber 28 of FIB system 10 has been greatly simplified relative to FIG. 1 (including leaving some specific components out of the pictures) to better illustrate the details of the preferred embodiment. Likewise, the scale and dimension of chip 24 has been greatly exaggerated to facilitate the illustration of germane aspects of the preferred method. Finally, in addition to the illustrations in FIGS. 2A–C, FIG. 3 provides a flow diagram showing the major steps involved in practicing the method of the preferred embodiment.

Turning now to FIG. 2A, the simplified view of chamber 28 is provided, showing stage 26, nozzle cluster 62, and ion source 16. At the commencement of the process, chip 24 would be placed in chamber 28 on stage 26 (step 300, FIG. 3). In FIG. 2A (as well as the other figures in the sequence) chip 24 is shown in a side, sectioned view. Through the sectioning, chip 24 (which is highly simplified for purposes of illustration) is shown to be made up of a silicon substrate 100, on top of which is positioned a layer of an insulative dielectric, which in the preferred embodiment is a layer of silicon dioxide 102. Disposed vertically on one side of chip 24 is contact stud 104a, and on the other side of chip 24 is contact stud 104b. Studs 104a and 104b may be made of copper, or they can be made of other metals such as tungsten. Connecting studs 104a and 104b is a horizontal conductive line 110, which is essentially a conductive wire and is made of copper. Disposed around studs 104a, 104b, and line 110 is yet another layer 112 of insulative silicon dioxide. Finally, the top layer of passivation for chip 24 is layer 114 comprised of silicon nitride. Newer chip designs may substitute any one of a number of low-k dielectric material for the silicon dioxide layers surrounding the copper lines.

Having described the layers and elements of (simplified) chip 24, it will now be assumed, for purposes of the further detailed discussion of the preferred embodiment, that it has been determined that chip 24 needs to be repaired. Specifically, it has been determined that when chip 24 was originally manufactured, the connection between stud 104a and 104b was made in error, and therefore in order to repair chip 24 copper line 110 connecting stud 104a and 104b needs to be cut. Accordingly, the balance of the discussion in this detailed description is on how that is accomplished using the resources of FIB system 10.

In order to gain access to line 110 the layers above line 110 need to be removed to expose it to processing. Accordingly, layer 114 of silicon nitride and layer 112 of silicon dioxide must first be removed by means of processing in FIB system 10. With respect to the processing parameters of FIB system 10, in the preferred embodiment, a Micrion model 9100 was used, wherein it was equipped with a 30 keV gallium ion source, thereby producing a 10 nanometer minimum beam spot size. The beam current was varied from 50 to 250 picoamps It should be noted that although the preferred embodiment is based upon a 10 nm beam, in an alternate embodiment, a Micrion model 9500 was used as FIB system 10, wherein it was equipped with a 50 keV gallium ion source, thereby producing a 5 nanometer minimum beam spot size. When shifting over to the 5 nm beam spot some minor beam scan parameters needed to be adjusted to account for the different spot size and beam current density. Such adjustments related to the beam dwell time, pixel spacing, end-of-raster gas refresh time, and the like, all such adjustments would be known to one skilled in the art. In FIB system 10, chamber 28 had an initial base pressure of $10^{-7}$ torr which was eventually dropped to $10^{-5}$ torr when a flow of the reactive gas in the chamber commenced. It should be noted that in FIB system 10 pressure is monitored a considerable distance from chip 24, so it may not accurately reflect the pressure in the immediate reactive environment. It is believed, however, that the actual gas concentration in the immediate area of chip 24 is on the order of $10^{-3}$ to $10^{-4}$ torr, or so. Processing is done at ambient room temperature with no RF or magnetic fields applied. All reaction kinetics are supplied by surface collision energy transfer from the primary beam 20 from ion source 16 striking the surface of chip 24.

FIG. 2B provides the next illustration in the sequence showing the removal of layer 114 and 112, which is the process by which a hole 118 (the so-called "elevator shaft") is cut to expose line 110. Using the process parameters discussed above, in order to remove nitride and oxide layers 114 and 112, a xenon difluoride ($XeF_2$) gas 120a is introduced into chamber 28 by nozzle cluster 62 (step 302, FIG. 3.). A gallium ion beam 20 is then directed at the top surface of chip 24. As discussed above in connection with FIG. 1, the nozzles (not individually shown in FIG. 2A–C) can be directed at the location at which beam 20 contacts chip 24, thereby concentrating gas 120a in that local to provide the chemistry for ion beam etching. It should be noted that SiLK and other organic interlevel dielectrics may require some other techniques, known to those skilled in the art, to achieve the best drilling profiles. These usually include varying the primary beam (gallium) parameters to make the $XeF_2$ etch efficient, or include changing the chemistry, such as by introducing in chamber 28 a water vapor. As shown in FIG. 2B, and using the process parameters discussed above, a 1.0 um diameter "elevator shaft" (hole 118) was drilled thru 4.5 um of the dielectric comprising layers 114 and 112, using the $XeF_2$ gas (step 304, FIG. 3). It should also be noted that during the removal of layers 114 and 112, the vacuum of pumping system 32 (shown in FIG. 1) will be operational for the purpose of drawing the gases and vaporized dielectric composition of these layers out of chamber 28. Hence, as a result of this vacuum operation, chamber 28 should be cleared of any residual gases and vapors from the drilling of hole 118, and the base pressure of the chamber should be reestablished before the next process step commences (step 306, FIG. 3).

Having exposed copper line 110 through the procedure described above, the next objective of the process is to remove a portion of copper line 110, for the purpose of severing the connection between stud 104a and stud 104b. FIG. 2C provides the next illustration in the sequence. In connection with the cutting of copper line 110 the FIB system 10 parameters discussed above are generally maintained; however, at this stage of the process nozzle cluster 62 will introduce a gas 120b, which is a combination of nitrogen ($N_2$) and oxygen ($O_2$), into chamber 28 (step 310, FIG. 3). Again the nozzles of nozzle cluster 62 would be directed at the location where the gallium ion beam 20 contacts chip 24, thereby enhancing the beam etching process. As seen in FIG. 2C, beam 20 reacting together with the ($N_2/O_2$) gas will etch away copper line 110, thereby accomplishing the objective of cutting the electrical connection between stud 104a and 104b (step 312, FIG. 3).

In the preferred embodiment, gas 120b is an equal proportion of nitrogen and oxygen in the form of $N_2/O_2$. The use of the combination of nitrogen and oxygen as the gas 120b in chamber 28 for the cutting of a copper line 110, has been found to yield a number of significant advantages. For example, $N_2/O_2$ has consistently yielded clean, uniform cuts in the copper material, with little or no sign of redeposition of the copper or copper by-products on the sidewalls of hole 118 in the dielectric layers 112 and 114. This is desirable for the purpose of insuring that no unintended electrical contact structures form in chip 24 as a result of the copper removal process. Also, electrical tests confirm that the process yields a successful cut through the copper such that, in the example shown, the line 110 between stud 104a and 104b is truly eliminated. Furthermore, in connection with the development of the preferred embodiment, testing was done on exposed copper films. Those tests revealed that when a gaseous combination of nitrogen ($N_2$) and oxygen ($O_2$) are introduced to copper, and then targeted with the ion beam, there was clean etching in the specific target area with no spontaneous attack outside of the target region. This suggests that active species were only formed in the presence the ion beam and that the defined process is, indeed, a beam driven reaction. This being the case, it is also logical to conclude that no damage will occur elsewhere in the process chamber. For these many reasons, the combination of nitrogen ($N_2$) and oxygen ($O_2$) for use in the ion beam chamber when cutting copper has been found to be highly advantageous. Furthermore, in the preferred embodiment, gas 120*b*, being an equal proportion of oxygen and nitrogen, was obtained through the use of a two channel gas system in which mixing occurred at the point of delivery. As these two gasses are chemically compatible, it would be possible to obtain a pre-mixed source vessel and deliver them to chip 24 through a single gas in the form of $N_2/O_2$.

The process of the preferred embodiment ends with the cutting of copper line 110. It will be clear to those skilled in the art that after line 110 is so cut, it can be grounded or it can be rerouted to make connection with other electrical elements on chip 24. Accordingly, once copper line 110 is cut as described additional process steps can be undertaken to simply fill the existing hole in chip 24 with a dielectric material or to add in other conductive material to establish new and different electrical connections. Such additional processing steps are not encompassed within the scope of this detailed description.

Also, it will be appreciated by those skilled in the art that the method of the present invention is not limited to the preferred embodiments discussed above. In particular it will be known by those skilled in the art that modifications can be made without departing from the spirit of the invention. For example, the exact mixture of nitrogen ($N_2$) and oxygen ($O_2$) can be varied so that they are not necessarily equal. Also, different types of FIB systems can be used with corresponding adjustments to their specific process settings. Furthermore, the overall process can be adapted in the event that the insulative dielectric covering the copper is not silicon dioxide, but is instead some alternate material, such as a low K dielectric. In any such event, the process can be adjusted to drill the elevator shaft through such alternate material, and then use the nitrogen ($N_2$) and oxygen ($O_2$) gas together with the ion beam to cut the copper. Further still, the process of the preferred embodiment can be used to remove not simply a copper line, but any copper structure, such as a copper contact or stud. Accordingly, any such modifications are considered within the scope of the invention, and the invention is limited solely by the appended claims.

What is claimed is:

1. A method of processing a semiconductor chip containing copper, comprising the steps of:
    placing said chip inside a processing chamber;
    introducing a combination of $N_2$ and $O_2$ into said chamber; and
    directing a focused ion beam at said copper.

2. The method of claim 1, wherein said chip also contains non-copper materials, further comprising the step of selectively removing non-copper material on said chip to expose the portion of said copper to be focused upon by said beam.

3. The method of claim 2, wherein xenon difluoride gas is in said chamber during said selective removal of said non-copper material.

4. The method of claim 1, wherein said nitrogen and oxygen are introduced into said chamber in equal proportions.

5. The method of claim 1, wherein said beam is a gallium ion beam.

6. The method of claim 1, wherein said beam has a spot size that is a minimum of 10 nm.

7. The method of claim 1, wherein said chamber pressure is between $10^{-7}$–$10^{-3}$ torr during operation of said beam.

8. A method of repairing a semiconductor chip containing both copper and non-copper materials, said method comprising the steps of:
    placing said chip inside a processing chamber;
    selectively removing any non-copper material for the purpose of exposing said copper that is intended to be removed;
    introducing a combination of $N_2$ and $O_2$ into said chamber; and
    directing a focused ion beam at said copper.

9. The method of claim 8, wherein a gas, other than $N_2$ and $O_2$, is in said chamber during the selective removal of said non-copper material.

10. The method of claim 9, wherein said gas is xenon difluoride.

11. The method of claim 8, wherein said and $O_2$ are introduced into said chamber in equal proportions.

12. The method of claim 9, wherein said beam is a gallium ion beam.

13. The method of claim 8, wherein said beam has a spot size that is a minimum of 10 nm.

14. The method of claim 8, wherein said chamber pressure is between $10^{-7}$–$10^{-3}$ torr during operation of said beam.

15. A method of repairing a semiconductor chip by means of removing copper on said chip, said method comprising the steps of:
    placing said chip inside a processing chamber;
    introducing a first gas, other than nitrogen and oxygen, into said chamber;
    selectively removing any non-copper material on said chip for the purpose of exposing said copper that is intended to be removed;
    establishing the base pressure within said chamber;
    introducing a combination of $N_2$ and $O_2$ into said chamber; and
    directing a focused ion beam at said copper.

16. The method of claim 15, wherein said first gas is xenon difluoride.

17. The method of claim 15, wherein said $N_2$ and $O_2$ are introduced into said chamber in equal proportions.

18. The method of claim 15, wherein said beam is a gallium ion beam.

19. The method of claim 15, wherein said beam has a spot size that is a minimum of 10 nm.

20. The method of claim 15, wherein said chamber pressure is between $10^{-7}$–$10^{-3}$ torr during operation of said beam.

* * * * *